US006861906B2

(12) United States Patent
Mori et al.

(10) Patent No.: US 6,861,906 B2
(45) Date of Patent: Mar. 1, 2005

(54) HIGH-FREQUENCY SEMICONDUCTOR DEVICE

(75) Inventors: Kazutomi Mori, Tokyo (JP); Shintaro Shinjo, Tokyo (JP); Kousei Maemura, Tokyo (JP); Teruyuki Shimura, Tokyo (JP); Kazuhiko Nakahara, Tokyo (JP); Tadashi Takagi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/204,446
(22) PCT Filed: May 11, 2001
(86) PCT No.: PCT/JP01/03953
§ 371 (c)(1),
(2), (4) Date: Sep. 3, 2002
(87) PCT Pub. No.: WO02/056461
PCT Pub. Date: Jul. 18, 2002

(65) Prior Publication Data
US 2003/0011435 A1 Jan. 16, 2003

(30) Foreign Application Priority Data
Jan. 10, 2001 (JP) .................................. 2001-002476

(51) Int. Cl.$^7$ ................................................. H03F 3/68
(52) U.S. Cl. ................................. 330/295; 330/124 R
(58) Field of Search ............................ 330/295, 310, 330/311, 84, 124 R, 307

(56) References Cited

U.S. PATENT DOCUMENTS

| 3,042,875 A | * | 7/1962 | Higginbotham |
| 5,760,457 A | | 6/1998 | Mitsui et al. |
| 5,889,434 A | | 3/1999 | Shimura et al. |
| 6,448,859 B2 | * | 9/2002 | Morizuka |

FOREIGN PATENT DOCUMENTS

| EP | 212477 | 3/1987 |
| EP | 0 212 477 A1 | 3/1987 |
| EP | 597397 | 5/1994 |
| EP | 736908 | 10/1996 |
| JP | 10-98336 | 4/1998 |

OTHER PUBLICATIONS

Kazutomi Mori et al.: "A GSM900/DCS1800 dual–band MMIC power amplifier using outside–base/center–via–hol layout multifinger HBT" IEICE Transactions on Electronics, vol. E82–C, No. 11, pp. 1913–1920 11/99.

William Liu: "Failure mechanism in AlGaAs/GaAs power heterojunction bipolar transistors" IEEE Transactions on Electron Device, vol. 43, No. 2, pp. 220–227 02/96.

T. Shimura et al.: "1W Ku–band AlGaAs/GaAs power HBTs with 72% peak power–added efficiency" IEEE MTT–S International Microwave Symposium Digest, vol. 2, WE2A–6, pp. 687–390 05/94.

* cited by examiner

Primary Examiner—Henry Choe
(74) Attorney, Agent, or Firm—Oblon, Spivak, McClelland, Maier & Neustadt, P.C.

(57) ABSTRACT

A high-frequency semiconductor device according to the present invention achieves improvements in degradation of noise characteristics and a reduction in gain, and an improvement in reduction in power efficiency while suppressing a concentration of a current to multifinger HBTs. In the multifinger HBTs constituting a first stage and an output stage of an amplifier 10, basic HBTs 14 that constitute the multifinger HBT 12 corresponding to the first stage, are each made up of an HBT 14a and an emitter resistor 14b connected to the corresponding emitter of the HBT 14a, whereas basic HBTs 18 that constitute the multifinger HBT 16 corresponding to the output stage, are each comprised of an HBT 18a and a base resistor 18c connected to the corresponding base of the HBT 18a. The high-frequency semiconductor device according to the present invention is useful as a high output power amplifier used in satellite communications, ground microwave communications, mobile communications, etc.

14 Claims, 9 Drawing Sheets

HIGH-FREQUENCY SEMICONDUCTOR DEVICE

This application is a 371 of PCT/JP01/03953 filed May 11, 2001

TECHNICAL FIELD

The present invention relates to a high-frequency device, and particularly to improvements in power efficiency, noise characteristics and thermostability of an amplifier using multifinger heterojunction bipolar transistors.

BACKGROUND ART

Upon the widespread use of recent portable terminals, e.g., cellular phones, a size and weight reduction has become a key factor for their development. A high output power amplifier has been recognized as a key part.

As a heterojunction bipolar transistor (Heterojunction bipolar transistor, hereinafter called "HBT") has a high current gain β, a GaAs-system HBT having an emitter comprised of AlGaAs and a base comprised of GaAs is often used in a high output power amplifier for a cellular phone along with its high-speed property.

In order to realize an increase in output, the HBT needs a large emitter size for the purpose of obtaining a predetermined output. In order to obtain such a large emitter size, the so-called multifinger configuration is needed wherein a plurality of HBTs made up of emitters narrow in width to reduce base resistances are connected in parallel. An HBT having such a multifinger configuration will hereinafter be called a "multifinger HBT", and individual HBTs that constitute this multifinger HBT, will hereinafter be called "basic HBTs."

FIG. 11 is a block diagram showing a configuration of a conventional high output power amplifier.

In FIG. 11, reference numeral 100 indicates a power amplifier, 102 indicates a multifinger HBT which serves as a first stage of the power amplifier 100, and 104 indicates basic HBTs of the multifinger HBT 102. X11, X12, . . . , X1$m$ are connected in parallel as the basic HBTs. Each of the basic HBTs 104 comprises an HBT 104$a$ and an emitter resistor 104$b$ connected in series with an emitter electrode of the HBT 104$a$. Signal power is inputted to a base electrode of the HBT 104$a$ in each basic HBT 104, and an amplified signal output is outputted from a collector electrode of the HBT 104$a$. The emitter electrode of each HBT 104$a$ is grounded via the emitter resistor 104$b$.

Reference numeral 106 indicates a multifinger HBT which serves as an output stage of the amplifier 100. Reference numerals 108 indicate basic HBTs of the multifinger HBT 106. X21, X22, . . . , X2$n$ are connected in parallel as the basic HBTs. Each basic HBT 108 is identical in configuration to each basic HBT 104 of the multifinger HBT 102. The basic HBT 108 comprises an HBT 108$a$ and an emitter resistor 108$b$ connected in series with an emitter electrode of the HBT 108$a$. Signal power is inputted to a base electrode of the HBT 108$a$ in each basic HBT 108, and an amplified signal output is outputted from a collector electrode of the HBT 108$a$. The emitter electrode of the HBT 108$a$ is grounded via the emitter resistor 108$b$.

Reference numeral 110 indicates an input terminal, 112 indicates an output terminal, 114 indicates a source voltage terminal, 116 indicates a base bias circuit, and 118, 120, 122, 124, 126, 128 and 130 indicate matching circuits, respectively.

When the HBT 104$a$ and the HBT 108$a$ each are brought to a high temperature, forward voltages VBE of their bases become low. A compound semiconductor substrate such as GaAs or the like is high in thermal resistance. Therefore, when a current concentrates on one HBT 104$a$ and one HBT 108$a$ due to any cause where a large number of HBTs 104$a$ and HBTs 108$a$ are connected and disposed in parallel, a problem arises that heat generated in each of the HBT 104$a$ and HBT 108$a$ will rise and VBE will decrease, and the current will concentrate further more on such a portion.

Now, the thermal resistance ΘTH is defined by the following expression: ΘTH=ΔTj/ΔP. In the expression, Tj indicates a junction temperature, and P indicates power.

It has been reported by, for example, IEEE TRANSACTIONS ON ELECTRON DEVICES, VOL. 43, NO. 2, FEBRUARY 1996, pp220–227 that since the basic HBTs are thermally ununiform therebetween, the concentration of a current on a certain one basic HBT occurs and consequently a sudden change in operating current takes place.

When the current concentrates on specific HBTs 104$a$ and 108$a$ in the multifinger HBTs 102 and 106, the number of operated HBTs 104 and 108 is reduced and hence power proportional to a size cannot be obtained. Therefore, resistors are inserted in series with their corresponding bases or emitters of the HBTs 104$a$ and 108$a$ to prevent the concentration of the current on the specific HBTs 104$a$ and 108$a$, thereby reducing a current amplification gain so as to restrain the concentration of the current.

In the power amplifier 100, the emitter resistors are inserted in series with the emitter electrodes of the HBTs 104$a$ and 108$a$ to constitute the basic HBTs 104 and 108.

However, when the resistors are inserted in series with the bases or emitters of the HBTs 104$a$ and 108$a$, the power amplifier 100 is degraded in performance.

That is to say, since the mere insertion of the base resistors will result in the insertion of the resistors into the inputs, losses are produced and noise characteristics are degraded due to their losses. Further, the gain of each HBT is reduced due to the occurrence of the losses.

On the other hand, when the emitter resistors are simply inserted as in the basic HBTs 104 and 108, Vce is reduced due to voltage drops developed by the emitter resistors 104$b$ and 108$b$, thereby causing degradation in power efficiency.

Thus, the insertion of the resistors in series with the bases or emitters to reduce the current amplification gain so as to restrain the concentration of the current is effective in preventing the thermal ununiformity of each basic HBT. However, a problem arises in that when the resistors are simply inserted in series with the bases or emitters, noise characteristics are degraded, the gain of each HBT is lowered, and power efficiency is reduced.

Further, a configuration of an HBT device using an emitter ballast resistor and a configuration of an HBT device using a base ballast resistor have been described in Japanese Patent Laid-open No. Hei 8(1996)-279561 as the known reference.

Furthermore, a configuration of an HBT device using an emitter ballast resistor has been described in IEEE MTT-S Digest WE2A-6, 1994, p687–p690.

FIG. 12 is a block diagram of a conventional HBT multistage amplifier configured using only HBT devices which make use of emitter ballast resistors.

In FIG. 12, a multifinger HBT102, which serves as a first stage of an HBT multistage amplifier 140, and a multifinger HBT106, which serves as an output stage, are made up of basic HBTs having emitter ballast resistors connected in series with emitter electrodes in a manner similar to FIG. 11. All of intermediate stages provided between the first stage and the output stage are also made up of multifinger HBTs comprised of basic HBTs having emitter ballast resistors connected in series with emitter electrodes.

FIG. 13 is a block diagram of a conventional HBT multistage amplifier constructed using only HBT devices using base ballast resistors.

In FIG. 13, an HBT multistage amplifier 142, i.e., all of a first stage to an output stage including intermediate stages are made up of multifinger HBTs 144 comprised of basic HBTs having base ballast resistors.

Thus, the conventional HBT multistage amplifiers 140 and 142 are made up of only the multifinger HBTs using the emitter ballast resistors, and only the multifinger HBTs using the base ballast resistors, respectively.

Since resistors each are inserted between an emitter and a ground, a multifinger HBT using emitter ballast resistors generally causes an increase in loss on both the input and output sides of an amplifier as compared with the case in which no resistors are provided. Since the loss is inflicted even on the output side, the amplifier is reduced in output power and efficiency characteristic.

Since resistors each are inserted between a base and a bias terminal, a multifinger HBT using base ballast resistors causes no loss on the output side. Therefore, the output power and efficiency characteristics are satisfactory as compared with the multifinger HBT using the emitter ballast resistors. Since, however, a large loss is inflicted on the input side, noise characteristics are degraded as compared with the multifinger HBT using the emitter ballast resistors.

In summary, the multifinger HBT144 using the base ballast resistors is better in output power and efficiency characteristic more than the multifinger HBTs 102 and 106 using the emitter ballast resistors; the multifinger HBTs 102 and 106 are better in noise characteristic than the multifinger HBT144.

Therefore, a problem arises in that the HBT multistage amplifier 140 comprising only the multifinger HBTs using the emitter ballast resistors is good in noise characteristic but becomes poor in output power and efficiency characteristic. On the other hand, a problem arises in that the HBT multistage amplifier 142 made up of only the multifinger HBTs144 using the base ballast resistors is good in output power and efficiency characteristic but becomes poor in noise characteristic.

An amplifier used in a transmitter includes specs of receiving-band noise as well as high-output and high efficiency characteristics and requires even low noise characteristics. It is therefore necessary to simultaneously realize the high-output and high-efficiency characteristics and the low noise characteristics. A problem arises in that the HBT multistage amplifier 140 or 142 having the conventional configuration is not capable of simultaneously realizing the high-output and high-efficiency characteristics and the low noise characteristics but realizing only either one of them.

The present invention has been made to solve such problems. A first object of the present invention is to provide a high-frequency semiconductor device provided with an amplifier circuit which lessens degradation in high frequency characteristic and provides high thermal stability by configuring an amplifier circuit which lessens degradation in noise characteristic and a reduction in HBT's gain and provides less reduction in power efficiency while the concentration of a current on a multifinger HBT is being restrained.

A second object of the present invention is to provide a high-frequency semiconductor device equipped with an amplifier circuit which is high in stability relative to the concentration of a current and high in reliability.

A third object of the present invention is to provide a high-frequency semiconductor device provided with an HBT multistage amplifier capable of simultaneously implementing high-output and high-efficiency characteristics and low noise characteristics.

Incidentally, while Japanese Patent Laid-open No. Hei 10(1998)-98336 has described an invention wherein a bias circuit capable of setting an operating current of an output transistor of an amplifier circuit regardless of a source voltage and in proportion to only a base-to-emitter voltage is used in a high-frequency amplifier circuit, whereby variations in saturated output level and distortion characteristic are reduced even if operating environments such as a source voltage, ambient temperatures vary, the inventions to be mentioned below are not described.

DISCLOSURE OF INVENTION

A high-frequency semiconductor device according to the present invention comprises: a first section of an amplifier circuit, wherein first basic transistors each having a first bipolar transistor of a heterojunction structure and an emitter resistor having a resistance value of RE1, which connected in series with an emitter electrode of the first bipolar transistor, are connected in parallel in a plural form and disposed on a first semiconductor substrate; and a second section of the amplifier circuit, which amplifies a signal outputted from the first section and in which second basic transistors each having a second bipolar transistor of a heterojunction structure and a base resistor having a resistance value of RB2, which is connected in series with a base electrode of the second bipolar transistor, are connected in parallel in a plural form and disposed on a second semiconductor substrate.

Accordingly, it is possible to reduce a noise factor, decrease a reduction in gain and lessen degradation in power efficiency with a simple structure while the concentration of a current is being suppressed. By extension, a high-frequency semiconductor device can be provided which is high in reliability, excellent in amplifying characteristic and high in power efficiency.

Further, the second basic transistors are further provided with emitter resistors connected in series with emitter electrodes of the second bipolar transistors, and the resistance values of the base resistors connected in series with the base electrodes of the second bipolar transistors are set smaller than RB2.

Accordingly, it is possible to improve noise characteristics. By extension, a high-frequency semiconductor device excellent in noise characteristic can be provided.

Further, an emitter interval between the adjacent first basic transistors in the first section of the amplifier circuit is set wider than an emitter interval between the adjacent second basic transistors in the second section of the amplifier circuit.

Accordingly, it is possible to reduce thermal resistance and make it hard to produce current concentration. By extension, a high-frequency semiconductor device can be provided which is high in stability with respect to the current concentration and high in reliability.

Further, the resistance values of the emitter resistors of the first basic transistors in the first section of the amplifier circuit are set smaller than RE1.

Accordingly, it is possible to lessen degradation in efficiency at a first section. By extension, a high-frequency semiconductor device high in power efficiency can be provided.

A high-frequency semiconductor device according to the present invention also comprises: a first section of an amplifier circuit, wherein first basic transistors each having a first bipolar transistor of a heterojunction structure, a base resistor having a resistance value of RB1, which is connected in series with a base electrode of the first bipolar transistor, and an emitter resistor having a resistance value of RE1, which is connected in series with an emitter electrode of the first bipolar transistor, are connected in parallel in a plural form at emitter intervals W1 each defined between emitters of the first basic transistors, and disposed on a first semiconductor substrate; and a second section of the amplifier circuit, which amplifies a signal outputted from the first section and wherein second basic transistors each having a second bipolar transistor of a heterojunction structure, a base resistor having a resistance of RB2, which is connected in series with a base electrode of the second bipolar transistor, and an emitter resistor having a resistance value of RE2, which is connected in series with an emitter electrode of the second bipolar transistor, are connected in parallel in a plural form at emitter intervals W2 each defined between emitters of the second basic transistors, and disposed on a second semiconductor substrate; wherein the intervals W1 and W2 are set as follows: w1>W2.

Accordingly, it is possible to reduce thermal resistance and make it hard to produce current concentration. By extension, a high-frequency semiconductor device can be provided which is high in stability with respect to the current concentration and high in reliability.

Further, a relationship between the resistance value RE1 of the emitter resistor of each first basic transistor and the resistance value RE2 of the emitter resistor of said each second basic transistor is established as follows: RE1<RE2; and a relationship between the resistance value RB1 of the base resistor of said each first basic transistor and the resistance value RB2 of the base resistor of said each second basic transistor is established as follows: RB1<RB2.

Accordingly, it is possible to reduce a noise factor, lessen a reduction in gain and lessen degradation in power efficiency while the concentration of a current is being restrained. By extension, a high-frequency semiconductor device can be provided which is high in reliability, excellent in amplifying characteristic and high in power efficiency.

Further, the first section of the amplifier circuit corresponds to a first stage, and the second section of the amplifier circuit corresponds to an output stage.

Accordingly, it is possible to reduce a noise factor at a first stage which most contributes to the noise factor and lessen degradation in power efficiency at an output stage which most contributes to the power efficiency. By extension, a high-frequency semiconductor device excellent in amplifying characteristic and high in power efficiency can be utilized effectively.

Further, the first semiconductor substrate and the second semiconductor substrate are integrally formed.

Accordingly, a size reduction can be achieved. By extension, a high-frequency semiconductor device can be provided which is small in size and low in cost.

A high-frequency semiconductor device according to the present invention also comprises: a first amplifier circuit section including a first-stage amplifier circuit comprising a first bipolar transistor device of a heterojunction structure, which is connected with emitter ballast resistors; and a second amplifier circuit section which amplifies a signal outputted from the first amplifier circuit section and includes a final-stage amplifier circuit comprising a second bipolar transistor device of a heterojunction structure, which is connected with base ballast resistors.

Accordingly, low noise characteristics of a first amplifier circuit section including a first-stage amplifier circuit can be realized, and high-output and high-efficiency characteristics of a second amplifier circuit section including a final stage amplifier circuit can be realized. By extension, a high-frequency semiconductor device equipped with an HBT multistage amplifier capable of simultaneously realizing high-efficiency characteristics and low noise characteristics can be provided.

Further, the first bipolar transistor device is comprised of first basic transistors connected in parallel in a plural form, each having a first bipolar transistor of a heterojunction structure and an emitter ballast resistor connected to the first bipolar transistor, and the second bipolar transistor device is made up of second basic transistors connected in parallel in a plural form, each having a second bipolar transistor of a heterojunction structure and a base ballast resistor connected to the second bipolar transistor.

Accordingly, an increase in output is allowed and thermal runaway can be restrained. By extension, a high-frequency semiconductor device equipped with an HBT multistage amplifier, which provides a high output and high reliability, can be provided.

BEST MODE FOR CARRYING OUT THE INVENTION

In embodiments 1 to 3 to be described below, a power amplifier having a two-stage configuration, for example, will be described. However, they may not necessarily use the two-stage configuration. A configuration of a multi stage greater than the two stages may be adopted.

Embodiment 1

The present embodiment is one wherein a first stage and an output stage of an amplifier each comprise a multifinger HBT, each of basic HBTs constituting the first stage multifinger HBT is made up of an HBT and an emitter resistor connected to an emitter of the HBT, and each of basic HBTs constituting the multifinger HBT of the output stage is made up of an HBT and a base resistor connected to a base of the HBT.

Figure 1:
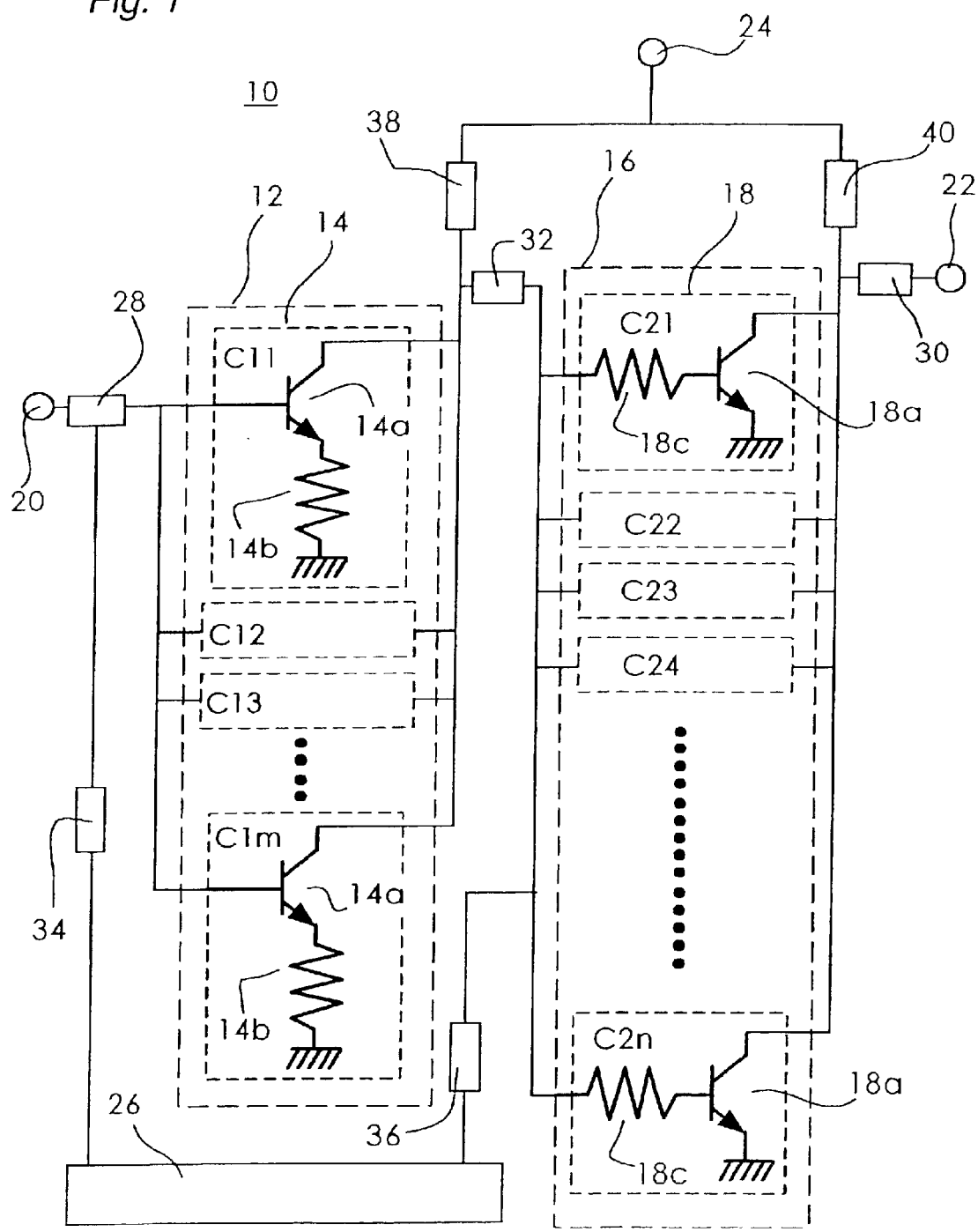
FIG. 1 is a block diagram showing a configuration of a high output power amplifier according to the present invention.

FIG. 1 is a block diagram showing a configuration of a high output power amplifier according to Embodiment 1.

In FIG. 1, reference numeral 10 indicates a power amplifier, 12 indicates a multifinger HBT used as a first part or section which serves a first stage of the power amplifier 10, and 14 indicate basic HBTs each used as a first basic transistor of the multifinger HBT12. The m basic HBTs are connected in parallel as C11, C12, . . . , C1m.

Each basic HBT14 comprises an HBT 14a, and an emitter resistor 14b connected in series with an emitter electrode of the HBT 14a.

The C11, C12, . . . , C1m of the basic HBTs 14 are of the same structure. The individual HBTs 14a and emitter resistors 14b have their respective circuit constants identical to one another. Each of the HBTs 14a has a current amplification gain β1 and each of the emitter resistors 14b has a resistance value RE1. Further, the basic HBTs 14 are spaced at emitter intervals W1. In the basic HBTs 14, signal power is directly inputted to the base electrode of each of the HBTs 14a, and an amplified signal output is outputted from the collector electrode of each of the HBTs 14a. The emitter electrodes thereof are grounded via the respective emitter resistors 14b.

Reference numeral 16 indicates a multifinger HBT used as a second part or section which serves as an output stage of the power amplifier 10. Reference numerals 18 each indicate a basic HBT used as a second basic transistor of the multifinger HBT16. The n basic HBTs are connected in parallel as C21, C22, . . . , C2n.

Each of the basic HBT18 comprises an HBT18a, and a base resistor 18c connected in series with a base electrode of the HBT18a.

The C21, C22, . . . , C2n of the basic HBTs 18 are of the same structure. The individual HBTs 18a and base resistors 18c have their respective circuit constants identical to one another. Each of the HBTs 18a has a current amplification gain β2 and each of the base resistors 18c has a resistance value RB2. Further, the basic HBTs 18 are spaced at the same emitter intervals W1 as the basic HBTs 14 of the multifinger HBT 12. In the HBTs 18, signal power is inputted to the base electrode of each of the HBTs18a via each of the base resistors 18c, and an amplified signal output is outputted from the collector electrode of each of the HBTs 18a. Emitter electrodes thereof are directly grounded.

The emitter resistor 14b and the base resistor 18c each comprise a thin-film resistor. The emitter resistor 14b may be formed simultaneously with the formation of an emitter layer by an epitaxial growth instead of the thin-film resistor.

Reference numeral 20 indicates an input terminal to which signal power is inputted, and 22 indicates an output terminal from which amplified signal power is outputted. Reference numeral 24 indicates a source voltage terminal to which Vcc is applied. Reference numeral 26 indicates a base bias circuit which generates a base voltage.

Reference numeral 28 indicates an input matching circuit connected to the input side of the first-stage multifinger HBT 12, and 30 indicates an output matching circuit connected to the output side of the multifinger HBT 16 of the output stage. Reference numeral 32 indicates an inter-stage matching circuit connected between the first-stage multifinger HBT 12 and the multifinger HBT 16 of the output stage. Reference numeral 34 indicates a matching circuit connected between the base electrodes of the first-stage multifinger HBT 12 and the base bias circuit 26, and 36 indicates a matching circuit connected between the base electrodes of the multifinger HBT 16 of the output stage and the base bias circuit 26. Reference numeral 38 indicates a matching circuit connected between the collector electrodes of the first-stage multifinger HBT12 and the source voltage terminal 24, and 40 indicates a matching circuit connected between the collector electrodes of the multifinger HBT16 of the output stage and the source voltage terminal 24.

In the first-stage multifinger HBT 12, a base voltage is applied from the base bias circuit 26 to the base electrode of each basic HBT 14 via the matching circuit 34, and Vcc is applied from the source voltage terminal 24 to the collector electrode of each basic HBT 14 via the matching circuit 38.

In the multifinger HBT 16 of the output stage, a base voltage is applied from the base bias circuit 26 to the base electrode of each basic HBT 18 via the matching circuit 36, and Vcc is applied from the source voltage terminal 24 to the collector electrode of each basic HBT 18 via the matching circuit 40.

The base electrodes of the multifinger HBT 12 are connected to the input terminal 20 through the input matching circuit 28, and the collector electrodes thereof are connected to their corresponding base electrodes of the multifinger HBT 16 of the output stage through the matching circuit 32. The collector electrodes of the multifinger HBT 16 of the output stage are connected to the output terminal 22 through the output matching circuit 30.

Figure 2:
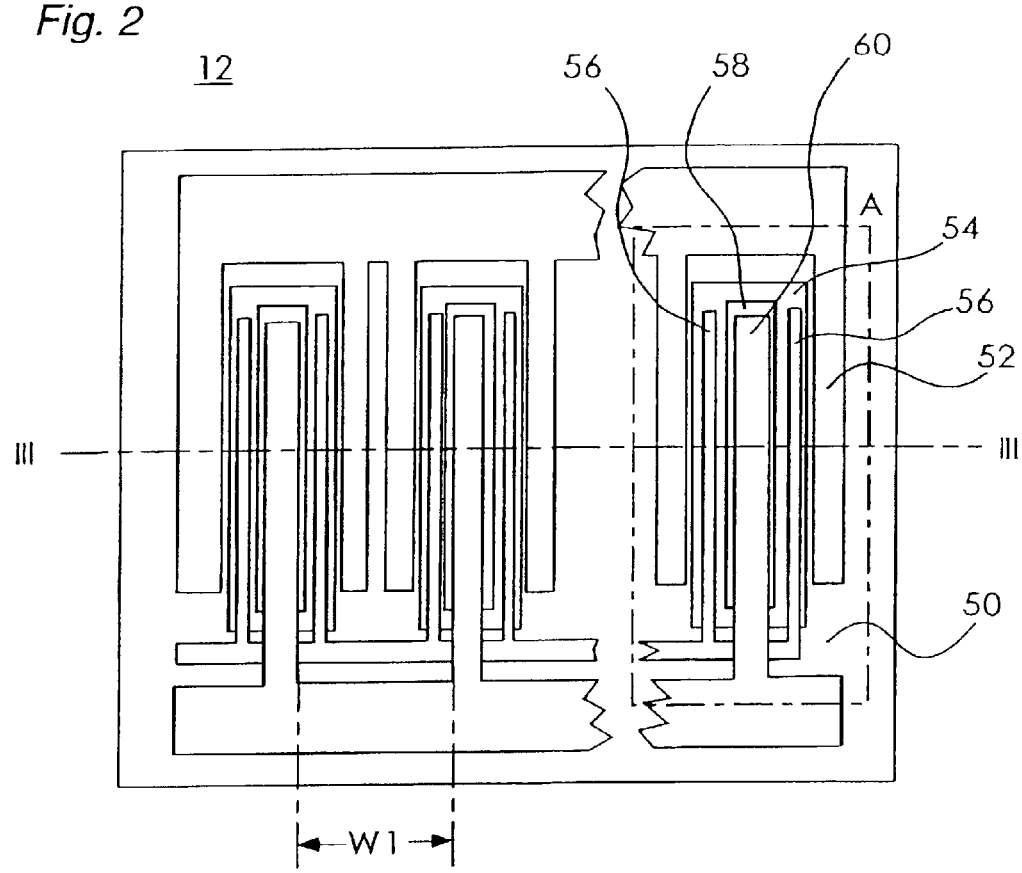
FIG. 2 is a plan view of a multifinger HBT which constitutes a high output power amplifier according to the present invention.
Figure 3:
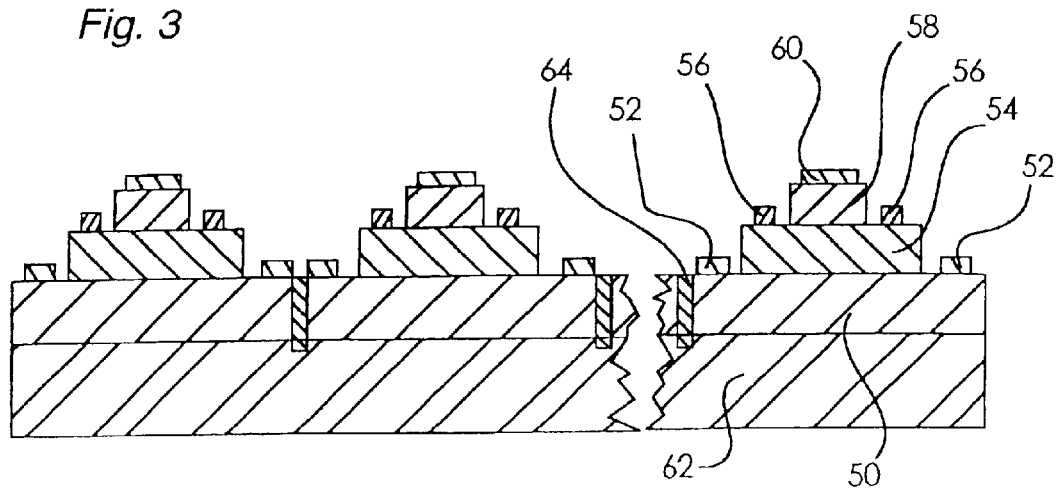
FIG. 3 is a cross-sectional view of the multifinger HBT taken along line III—III of FIG. 2.

FIG. 2 is a plan view of the multifinger HBT 12 which constitutes the initial stage of the power amplifier 10. An A portion surrounded by a chain line of FIG. 2 indicates the basic HBT 14. FIG. 3 is a cross-sectional view of the multifinger HBT 12 taken along line III—III of FIG. 2. The emitter resistors are not illustrated in FIGS. 2 and 3.

In FIGS. 2 and 3, reference numeral 50 indicates a collector layer which is composed of an $n^+$GaAs layer. Reference numerals 52 indicate collector electrodes. Reference numerals 54 indicate base layers each of which is disposed on the surface of the collector layer 50 with being interposed between the two collector electrodes 52 and is made up of a $p^+$GaAs layer. Reference numerals 56 indicate base electrodes disposed on the surface of the base layer 54. Reference numerals 58 indicate emitter layers each of which is disposed on the surface of the base layer 54 so as to be interposed between the two base electrodes 56. Reference numerals 60 indicate emitter electrodes each of which is disposed on the surface of the emitter layer 58. W1 indicates an emitter interval.

In FIG. 3, reference numeral 62 indicates a GaAs substrate used as a first semiconductor substrate, which has a surface on which the collector layer 50 is disposed. Reference numerals 64 indicate isolators each of which is formed by ion implantation of hydrogen ions H⁺ or the like. The isolator 64 extends through the collector layer 50 so as to reach from the surface of the collector 50 to the GaAs substrate 62.

The multifinger HBT 16 constituting the output stage of the power amplifier 10 is, although different in the number of the basic HBTs, similar in configuration to FIG. 2 showing the plan view of the multifinger HBT 12 constituting the first stage and FIG. 3 showing the cross-section view of the multifinger HBT 12.

Signal power applied to the input terminal 20 is inputted to the first-stage multifinger HBT 12 via the input matching circuit 28 so as to branch. The branched signal power are inputted to their corresponding base electrodes of the individual basic HBTs 14, where they are amplified. The signal power amplified by the individual basic HBTs 14 are outputted from their corresponding collector electrodes of the basic HBTs 14, after which they are combined into one which in turn is outputted from the first-stage multifinger HBT 12.

The signal power amplified by the first-stage multifinger HBT 12 is inputted to the multifinger HBT 16 of the output stage via the inter-stage matching circuit 32 so as to branch. The branched signal power are inputted to their corresponding base electrodes of the individual basic HBTs 18 via the base resistors 18c, after which they are amplified again. The signal power amplified by the individual basic HBTs 18 are outputted from their corresponding collector electrodes of the individual basic HBTs 18, after which they are combined into one which in turn is outputted from the multifinger HBT 16 of the output stage and outputted from the output terminal 22 via the output matching circuit 30.

The size of the multifinger HBT 16 of the output stage is determined according to output power required of the power amplifier 10. Assuming that the areas of the emitters require 10000 $\mu m^2$ to obtain an output power of 1 W, for example, a hundred of basic HBTs 18 are required when the areas of the emitters of the HBTs 18a constituting the basic HBT 18 are each 100 $\mu m^2$. In other words, the multifinger HBT 16 is made up of one hundred of the basic HBTs 18. If the gain of the output stage is 11 dB and the loss of the inter-stage matching circuit 32 is −1 dB, the output power required of the first-stage multifinger HBT 12 results in 0.1 W. That is, the output power is represented as follows:

$$1W = 10 \log 1000 \; dBm = 30 \; dBm, \; 30 \; dBm - 11 \; dB + 1 \; dB = 20 \; dBm = 0.1W$$

An emitter size to obtain this output, which is required of the first-stage multifinger HBT 12, is 1000 $\mu m^2$. When it is made up of HBTs 14a each having the emitter area of 100 $\mu m^2$, ten basic HBTs 14 are required.

In general, a resistance value of a resistor of each basic HBT varies according to a thermal resistance of a GaAs substrate. Assuming that the thickness of the GaAs substrate is 100 $\mu m$, for example, a base resistor connected in series with its corresponding base electrode of the basic HBT results in RB=about 100 Ω. Assuming that a current amplification gain β of each HBT is 100, an emitter resistor connected in series with its corresponding emitter electrode needs RE=1 Ω(=100 Ω/100) as an emitter resistance.

In order to suppress deterioration in characteristic due to the concentration of currents on the multifingers HBT, the basic HBTs need the addition of the base resistors or emitter resistors referred to above.

In the conventional example, the first stage and the output stage are also set identical in configuration and the basic HBTs are simply connected with the emitter resistors even in the case of both the initial stage and the output stage. In the power amplifier according to the present embodiment, however, the basic HBTs14 of the first stage are each provided with the emitter resistor 14b alone, and the basic HBTs 18 of the output stage are each provided with the base resistor alone.

Assuming that power efficiency of the multifinger HBT 16 of the output stage is set as 50% to obtain an output power of 1 W from a source voltage 2 V, a collector current Ic is represented in the following manner:

$$Ic = 1/2/0.5 = 1A.$$

A collector current per basic HBT 18 results in 10 mA.

When each of the emitter resistors is provided as in the conventional example, a collector-to-emitter voltage Vce is represented as follows:

$$Vce = 2 - 0.1 \times 1 = 1.99.$$

Thus, a reduction in efficiency, which is equivalent to about 1% (=1.99/2), is produced.

Since, however, the basic HBTs 18 in the multifinger HBT 16 of the output stage are provided with the base resistors alone and with no emitter resistors in the power amplifier 10 according to Embodiment 1, such a reduction in efficiency is not produced.

On the other hand, since the basic HBTs 14 of the first-stage multifinger HBT 12 are added with the emitter resistors 14b, a 1% efficiency reduction occurs. However, it becomes insignificant in particular as compared with the output stage. That is, since a current that flows in the output stage, is 1000 mA and 1% thereof is 10 mA, whereas a current that flows in the first stage, is 100 mA and 1% thereof is 1 mA, contribution with or incident to the increase and decrease in current is small.

On the other hand, a noise factor NFt of the whole power amplifier is represented in the following manner with a noise factor of an i-th stage expressed as NFi and gain thereof as Gi:

$$NFt = NF1 + NF2/G1 + \ldots + NFi/Gi + \ldots$$

Therefore, since the gain of the first stage is 10 dB even if an input loss increases by 2 dB, and the noise factor of the output stage is degraded by 2 dB owing to the addition of each base resistor to the output stage, the degradation in the noise factor as the whole power amplifier 10 is suppressed as follows:

$$2 \; dB/10 \; dB = 0.2 \; dB.$$

Since the basic HBTs 14 of the first-stage multifinger HBT 12 are each added with the emitter resistor 14b alone, and the basic HBTs 18 in the multifinger HBT 16 of the output stage are each provided with the base resistor alone in the power amplifier 10 according to Embodiment 1, the first-stage multifinger HBT 12 produces no degradation in noise factor because the first-stage multifinger HBT 12 produces no loss in its input signal, and the multifinger HBT 16 of the output stage produces no drop in collector-to-emitter voltage and causes no reduction in power efficiency.

In the present invention as described above, improvements in the noise factor and gain are yielded and an enhancement of the power efficiency is yielded as the integrated whole of the power amplifier while preventing the concentration of the currents on the multifinger HBTs owing to the addition of the emitter resistors to the first state and the adoption of the base resistors for the output stage. By extension, a power amplifier can be constructed which is high in reliability, excellent in amplifying characteristic and high in power efficiency.

Embodiment 2

Embodiment 2 is one wherein in the output stage of Embodiment 1, the resistance value of each base resistor is slightly reduced and each emitter resistor compensates for the slight reduction in the resistance value. Further, the present embodiment is one wherein a further improvement in noise characteristic is made as compared with the power amplifier 10 according to Embodiment 1.

Figure 4:
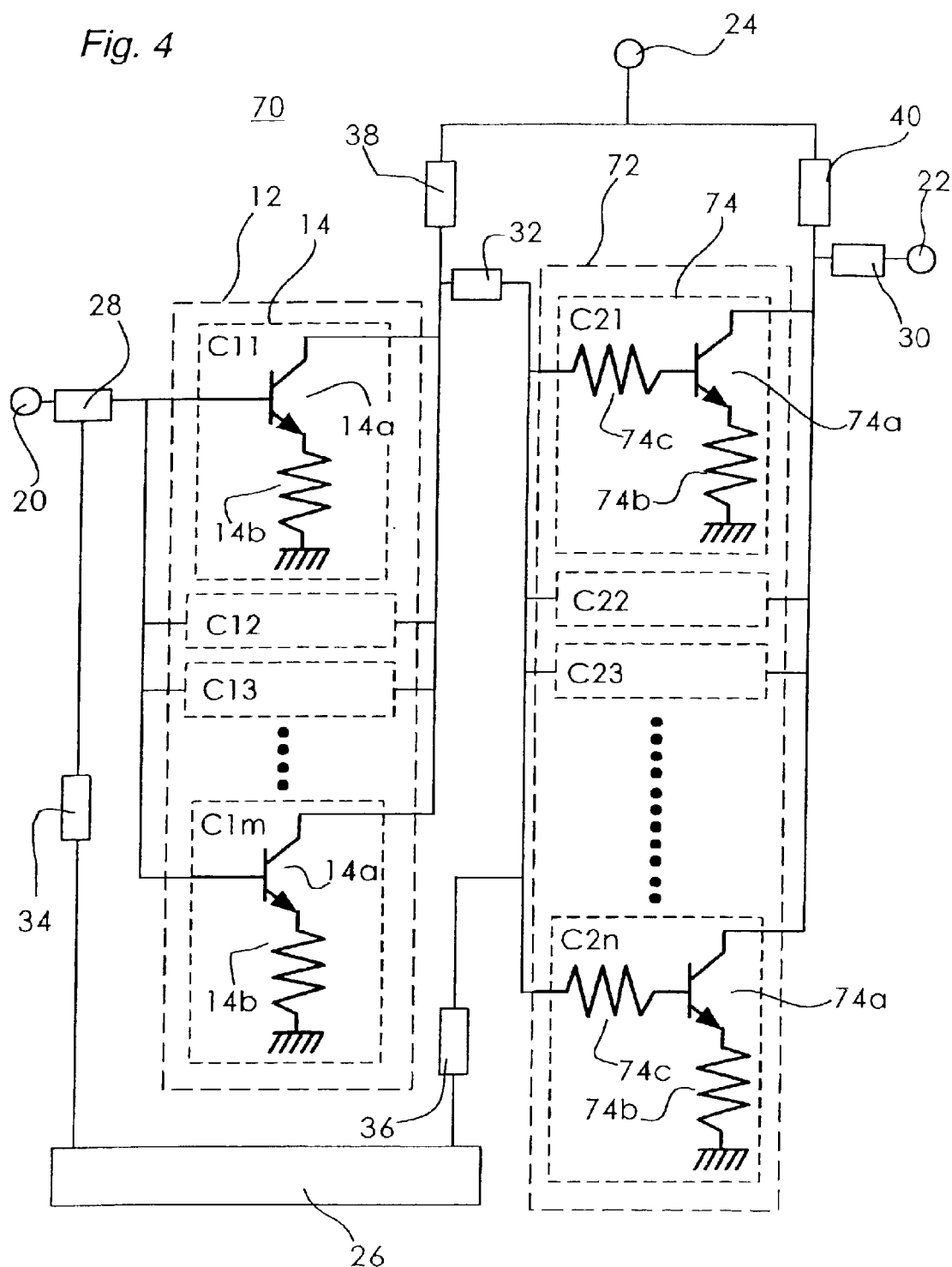
FIG. 4 is a block diagram showing a configuration of a high output power amplifier according to the present invention.

FIG. 4 is a block diagram showing a configuration of a high output power amplifier according to Embodiment 2.

In FIG. 4, reference numeral 70 indicates a power amplifier, 72 indicates a multifinger HBT used as a second part or section which serves as an output stage of the power amplifier 70, and 74 indicate basic HBTs each used as a second basic transistor of the multifinger HBT 72. The n basic HBTs are connected in parallel as C21, C22, . . . , C2n.

Each basic HBT 74 comprises an HBT 74a, a base resistor 74c connected in series with a base electrode of the HBT 74a, and an emitter resistor 74b connected in series with an emitter electrode of the HBT 74a.

The C21, C22, . . . , C2n of the basic HBTs 74 are of the same structure. The individual HBTs 74a, emitter resistors 74b and base resistors 74c respectively have circuit constants identical to one another. Each of the HBTs 74a has a current amplification gain $\beta3$, each of the emitter resistors 74b has a resistance value RE3, and each of the base resistors 74c has a resistance value RB3. Further, the basic HBTs 74 are spaced at the same emitter intervals W1 as the multifinger HBT 12.

In each of the basic HBTs 74, signal power is inputted to the base electrode of the HBT 74a via the base resistor 74c, and the amplified signal output is outputted from the collector electrode of the HBT 74a. The emitter electrode thereof is grounded via the emitter resistor 74b.

In FIG. 4, the same reference numerals as those in FIG. 1 indicate the same or corresponding ones. Further, they are similar even in the case of the following embodiments.

In the power amplifier 70, a first stage is identical in configuration to Embodiment 1 and basic HBTs 14 each make use of an emitter resistor 14b. Therefore, degradation in noise characteristic in the first stage is low. A problem resides in a circuit configuration of the output stage.

Assuming that a current amplification gain is $\beta$, the resistance value RE of the emitter resistor of each basic HBT and the base resistor RB satisfies the relation in RE=RB/$\beta$. Therefore, if the base resistors of the output stage, which influence the noise characteristics, are reduced and the emitter resistors compensate for the reduction, degradation in noise characteristic can be reduced while the concentration of a current is being prevented.

That is, assuming that the resistance value of the base resistor of each basic HBT 18 of Embodiment 1 is given as RB2, the basic HBT 74 of Embodiment 2 may set RB2 as follows:

$$RB2=RB3+RE3/\beta3.$$

That is, RB3 is represented as follows:

$$RB3=-RE3/\beta3$$

RB3<RB2 is established. The power amplifier 70 according to the present embodiment is improved in noise characteristic as compared with the power amplifier 10 according to Embodiment 1.

Embodiment 3

Embodiment 3 is one wherein a first stage and an output stage of an amplifier are each made up of a multifinger HBT, and basic HBTs constituting the multifinger HBT each comprises an HBT, a base resistor connected to the corresponding base electrode of the HBT and an emitter resistor connected to the corresponding emitter of the HBT, the intervals between the emitters of the basic HBTs constituting the first-stage multifinger HBT are set larger than the intervals between the emitters of the basic HBTs of the multifinger HBT of the output stage, the emitter resistors of the first stage are set smaller than the emitter resistors of the output stage, and the base resistors of the first stage are set smaller than the base resistors of the output stage.

Figure 5:
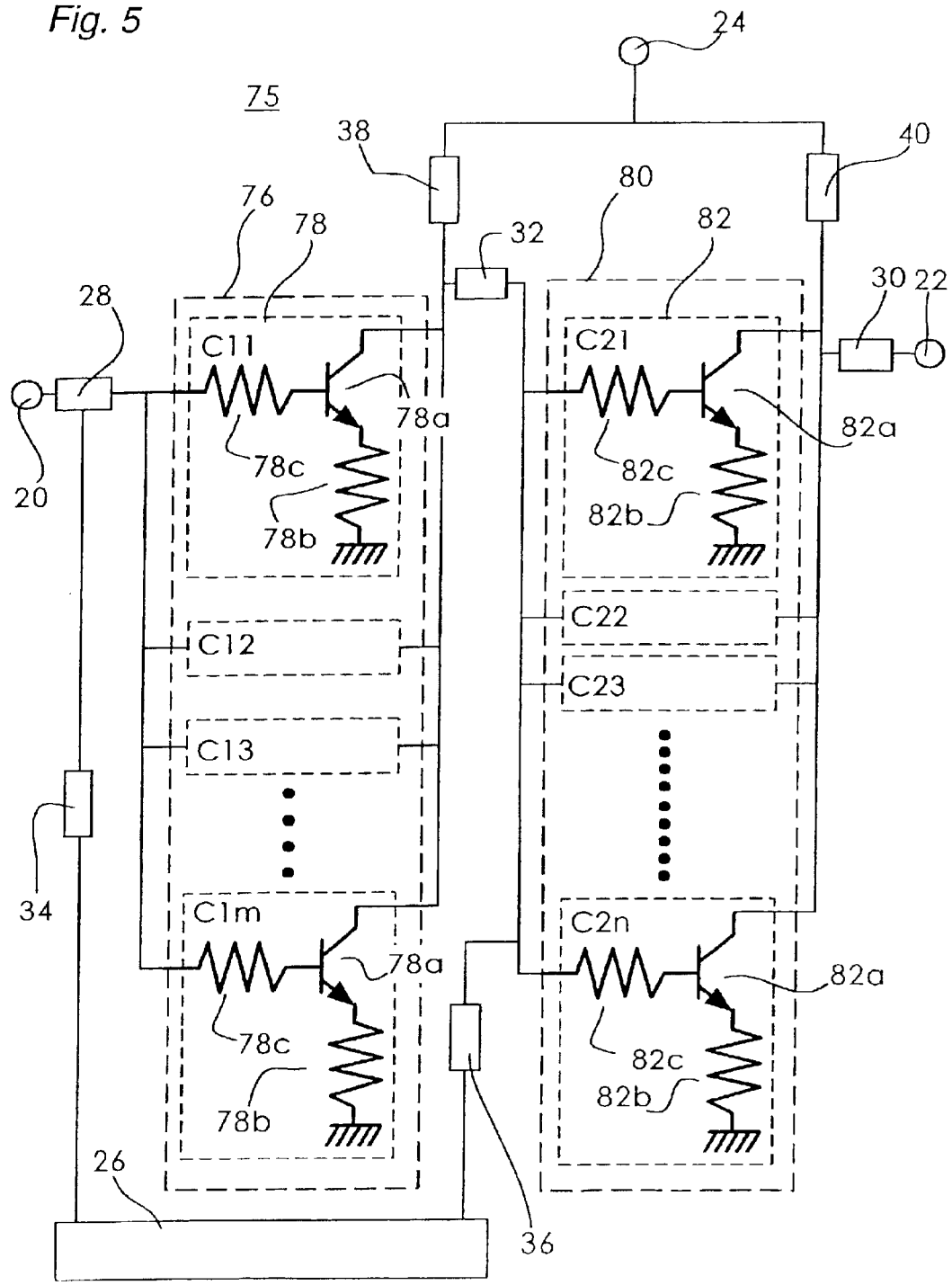
FIG. 5 is a block diagram showing a configuration of a high output power amplifier according to the present invention.

FIG. 5 is a block diagram showing a configuration of a high output power amplifier according to Embodiment 3.

In FIG. 5, reference numeral 75 indicates a power amplifier, reference numeral 76 indicates a multifinger HBT used as a first part or section which serves as a first stage of the power amplifier 75, and reference numerals 78 indicate basic HBTs each used as a first basic transistor of the multifinger HBT 12. The m basic HBTs are connected in parallel as C11, C12, . . . , C1m.

Each basic HBT 78 comprises an HBT 78a, an emitter resistor 78b connected in series with an emitter electrode of the HBT 78a, and a base resistor 78c connected in series with a base electrode.

The C11, C12, . . . , C1m of the basic HBTs 78 are of the same structure. The individual HBTs 78a, emitter resistors 78b and base resistors 78c respectively have circuit constants identical to one another. Each of the HBTs 78a has a current amplification gain $\beta5$, each of the emitter resistors 78b has a resistance value RE5, and each of the base resistors has a resistance value RB5. Further, the basic HBTs 78 are spaced at emitter intervals W5.

In each of the basic HBTs 78, signal power is inputted to the base electrode of the HBT 78a via the base resistor 78c, and the amplified signal output is outputted from the collector electrode of the HBT 78a. The emitter electrode of the HBT 78a is grounded via the emitter resistor 78b.

Reference numeral 80 indicates a multifinger HBT used as a second part or section which serves as an output stage of the power amplifier 75, and 82 indicates basic HBTs each used as a second basic transistor of the multifinger HBT 80. The n basic HBTs are connected in parallel as C21, C22, . . . , C2n.

Each of the basic HBTs 82 comprises an HBT 82a, a base resistor 18c connected in series with a base electrode of the HBT 82a, and an emitter resistor 82b connected in series with an emitter electrode.

The C21, C22, . . . , C2n of the basic HBTs 82 are the same structure. The individual HBTs 82a, emitter resistors 82b and base resistors 82c respectively have circuit constants identical to one another. Each of the HBTs 82a has a current amplification gain $\beta6$, each of the emitter resistors 82b has a resistance value RE6, and each of the base resistors 82c has a resistance value RB6. Further, the basic HBTs 82 are spaced at emitter intervals W6 narrower than at the multifinger HBT 76.

In each of the basic HBTs 82, signal power is inputted to the base electrode of the HBT 18a via the base resistor 82c, and the amplified signal output is outputted from the collector electrode of the HBTs 82a. The emitter electrode of the HBT 82a is grounded via the emitter resistor 82b.

The basic HBTs 78 and 82 are similar in basic configuration to Embodiment 1.

Assuming that in the multifinger HBT 80 of the output stage, an output power is 1 W and power efficiency at this time is 50%, power to be converted into heat results in 1 W. Similarly, assuming that in the first-stage multifinger HBT 76, an output power is 100 mW and power efficiency at this time is 50%, power to be converted into heat results in 100 mW. The amount of heat generated in the first state in this way is less than in the output stage.

Since the area of the multifinger HBT is proportional to output power, the area of the first-stage multifinger HBT 76 may take $\frac{1}{10}$ of the area of the multifinger HBT 80 of the output stage.

On the other hand, however, the more the area of a heat-generated portion is reduced, the more thermal resistance becomes high. To this end, when the area of the first-stage multifinger HBT 76 is set to $\frac{1}{10}$ of the area of the multifinger HBT 80 of the output stage so as to be proportional to an output power, the amount of heat generated in the multifinger HBT 75 is low but the thermal resistance thereof increases. Therefore, the resistance values of the base resistors and emitter resistors required for the basic HBT 76 for restraining heat concentration will result in magnitudes similar to the resistance values of the base and emitter resistors of the basic HBTs 82 of the multifinger HBT 80 of the output stage.

In the power amplifier according to Embodiment 3, the basic HBTs 82 of the output stage are densely spaced at emitter intervals W6 to an allowable extent as usual, and the basic HBTs 78 of the first stage are spaced at intervals W5 wider than the emitter intervals W6 employed in the output stage.

That is, W5 and W6 are represented as follows:

$$W5 > W6$$

Since the emitter intervals W5 are set wider than the emitter intervals W6 employed in the output stage, the thermal resistance does not increase, and the resistance values RB5 of the base resistors 78c constituting the basic HBTs 78 of the first stage can be set smaller than those of the base resistors 82c constituting the basic HBTs 82 of the output stage. That is, RB5 and RB6 can be represented as follows:

$$RB5 < RB6$$

Further, the resistance values RE5 of the emitter resistors 78b constituting the basic HBTs 78 of the first stage can be set smaller than the resistance values RE6 of the emitter resistors 82b constituting the basic HBTs 82 of the output stage. That is, RE5 and RE6 can be represented as follows:

$$RE5 < RE6$$

In the present embodiment, the emitter intervals of the first stage are made wider than the emitter intervals of the output stage, and the emitter resistors and base resistors of the basic HBTs of the first stage for preventing the concentration of a current on the first stage are set small. Consequently, enhancements of a noise factor and gain are yielded and a further improvement in power efficiency is yielded as the integrated whole of the power amplifier while preventing the concentration of a current on each multifinger HBT.

SPECIFIC EXAMPLES (i) When only the emitter resistors are used in the basic HBTs of the first stage and only the base resistors are used in the basic HBTs of the output stage:

In this case, the emitter intervals of the first stage are set wider than the emitter intervals of the output stage in Embodiment 1.

Since restraint on an efficiency reduction is taken into consideration, a relation of $RE=RB/\beta$ is established between an emitter resistor RE and a base resistor RB, based on a current amplification gain $\beta$ in view of each emitter resistor as the base. Since the amount of heat generated in the first stage is low, RB5 and RB6, and RE5 and RE6 can be represented as RB5<RB6 and RE5<RE6. The relationship therebetween is as follows:

$$RE5+RB5/\beta5 < RE6+RB6/\beta6$$

Assuming now that only the emitter resistors are provided for the basic HBTs of the first stage and only the base resistors are provided for the basic HBTs of the output stage, RB5=0 and RE6=0 and hence the above expression is rewritten as follows:

$$RE5 < RB6/\beta6$$

Here, $RB6/\beta6=RE1$ and RE5<RE1. In other words, the resistance values of the emitter resistors of the first stage can be made smaller by opening up or extending the emitter intervals of the first-stage multifinger HBT 12 of Embodiment 1 from W1 to W5, whereby a reduction in efficiency in the first stage can be suppressed.

(ii) When the emitter resistors and base resistors are used in the basic HBTs of the first stage and only the base resistors are used in the basic HBTs of the output stage:

This is a case in which an allowable value is set large with respect to the amount of degradation in noise characteristic and a further improvement in efficiency is achieved.

For example, Embodiment 1 is configured such that only the emitter resistors 14b are used in the basic HBTs 14 of the first stage, and only the base resistors 18c are used in the basic HBTs 18 of the output stage. Therefore, a reduction in efficiency due to the reduction in the efficiency of the first stage reaches 0.1% (=1 mA/(100 mA+1000 mA) over the whole power amplifier. However, if there is room to reduce a noise factor to some extent, restraint on the reduction in efficiency can be taken into consideration based on it.

In a manner similar to the above (i) even in this case, the relationship between RB5 and RB6, and RE5 and RE6 can be represented as follows:

$$RE5+RB5/\beta5 < RE6+RB6/\beta6$$

Since the emitter resistors of the output stage are not provided, RE6=0. That is, the above relationship is rewritten as follows:

$$RE5+RB5/\beta5 < RB6/\beta6$$

Accordingly, the emitter resistors of the first stage can be represented as follows:

$$RE5 < RB6/\beta6 - RB5/\beta6$$

Thus, the reduction in efficiency can further be restrained.

While the above-described embodiment has been described by the two-stage amplifier, similar effects can be brought about even as a stage prior to a multistage amplifier and a stage subsequent thereto.

Embodiment 4

Figure 6:
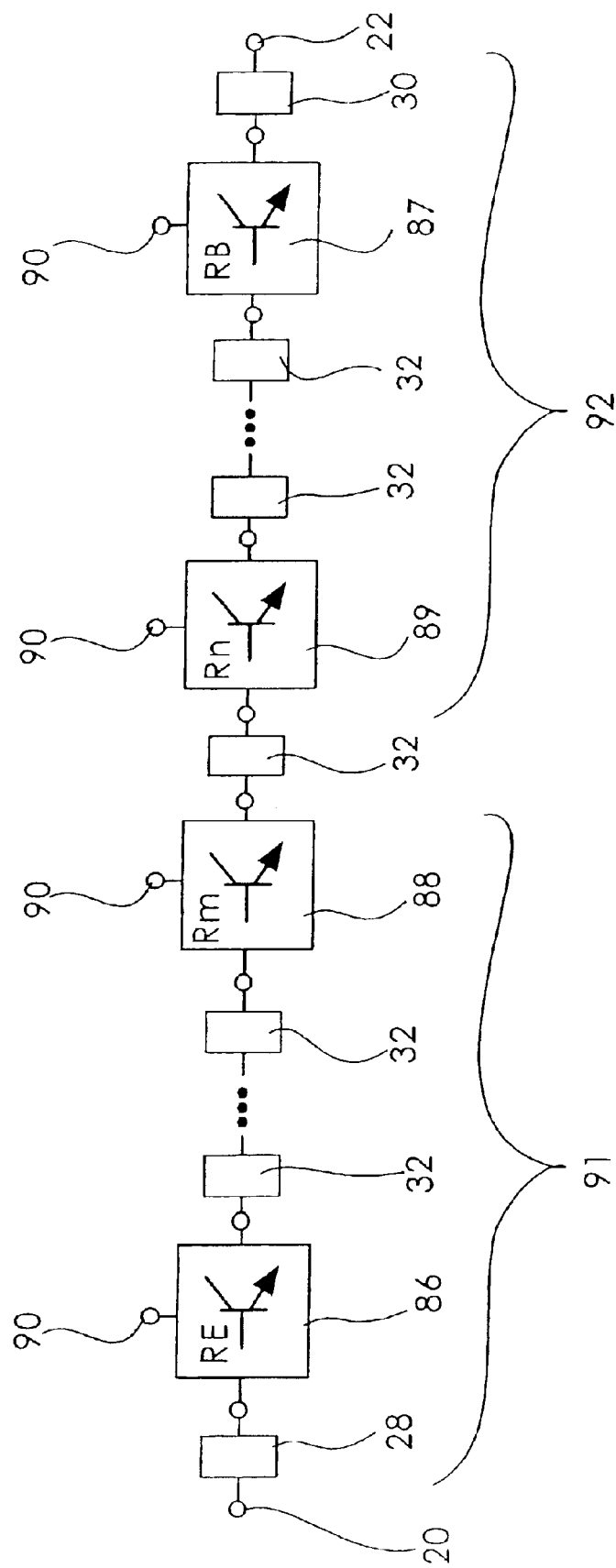
FIG. 6 is a block diagram showing an HBT multistage amplifier according to the present invention.

FIG. 6 is a block diagram showing an HBT multistage amplifier according to the present invention.

In FIG. 6, reference numeral 85 indicates an HBT multistage amplifier, 20 indicates an input terminal, 22 indicates an output terminal, 28 indicates an input matching circuit, 32 indicate inter-stage matching circuits, and 30 indicates an output matching circuit. In addition, reference numeral 86 indicates a first-stage HBT device using emitter ballast resistors, which is used as a first bipolar transistor device that constitutes a first-stage amplifier circuit, 87 indicates a final-stage HBT device using base ballast resistors, which is used as a second bipolar transistor device that constitutes a final-stage amplifier circuit, and 88 and 89 indicate intermediate stage HBT devices disposed as intermediate stage amplifier circuits between the first-stage HBT device 86 of the first-stage amplifier circuit and the final-stage HBT device 87 of the final-stage amplifier circuit. The intermediate stage HBT devices may be HBT devices using base ballast resistors or may be HBT devices using emitter ballast resistors.

Reference numerals 90 indicate base bias terminals for the first-stage HBT device 86, the intermediate stage HBT devices 88 and 89 and the final-stage HBT device 87. Reference numerals 32 indicate interstage matching circuits.

Reference numeral 91 indicates an input amplifier circuit used as a first amplifier circuit part or section, which includes the input matching circuit 28, the first-stage HBT device 86, the interstage matching circuits 32, and the intermediate stage HBT device 88.

Reference numeral 92 indicates an output amplifier circuit as a second amplifier circuit part or section, which includes the intermediate stage HBT device 89, the interstage matching circuit 32, the final-stage HBT device 87 and the output matching circuit 30.

Figure 7:
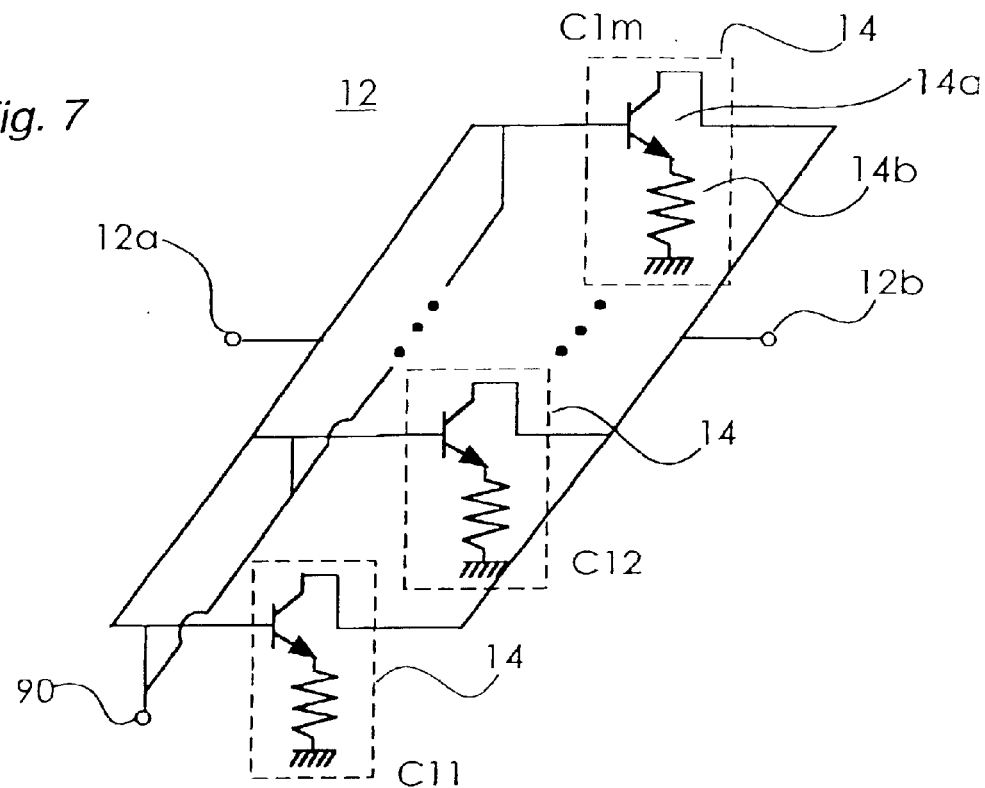
FIG. 7 is a typical diagram showing an equivalent circuit of a multifinger HBT using emitter ballast resistors, according to the present invention.
Figure 8:
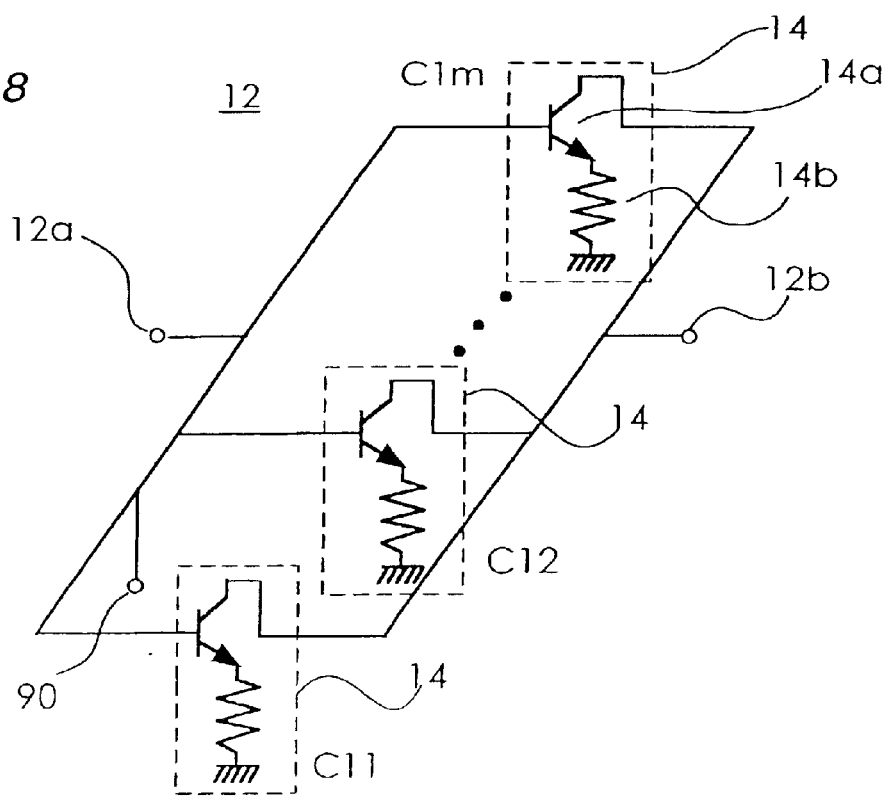
FIG. 8 is a typical diagram showing an equivalent circuit of a multifinger HBT using emitter ballast resistors, according to the present invention.

FIGS. 7 and 8 are respectively typical diagrams showing equivalent circuits of a multifinger HBT 12 using emitter ballast resistors, according to the present invention, e.g., the first-stage HBT device 86 shown in FIG. 6. Reference numeral 12*a* indicates a base terminal of the multifinger HBT 12, and 12*b* indicates a collector terminal of the multifinger HBT 12.

FIG. 7 shows a case in which the base bias terminal 90 is provided for each HBT 14, and FIG. 8 shows a case in which the base bias terminal 90 is common to all the HBTs 14. Emitter ballast resistors 14*b* are each inserted between an emitter of the HBT 14 and a ground. When the temperature of a certain HBT 14*a* is high due to a temperature distribution or the like, and consequently its emitter current (proportional to its collector current) increases, a voltage drop developed by an emitter ballast resistor 14*b* of the HBT 14*a* increases. Thus, a base-to-emitter voltage of such an HBT 14 is reduced and consequently the increase in emitter current is suppressed.

Accordingly, the emitter ballast resistors 14*b* make it possible to suppress low, a current between the HBTs 14*a* and the difference in temperature therebetween, restrain thermal runaway, and uniformly operate the respective HBTs 14*a*. Thus, the distribution and combination of signals for each of the respective HBTs 14*a* can be carried out with efficiency, and high-output and high-efficiency amplifying characteristics can be realized.

Figure 9:
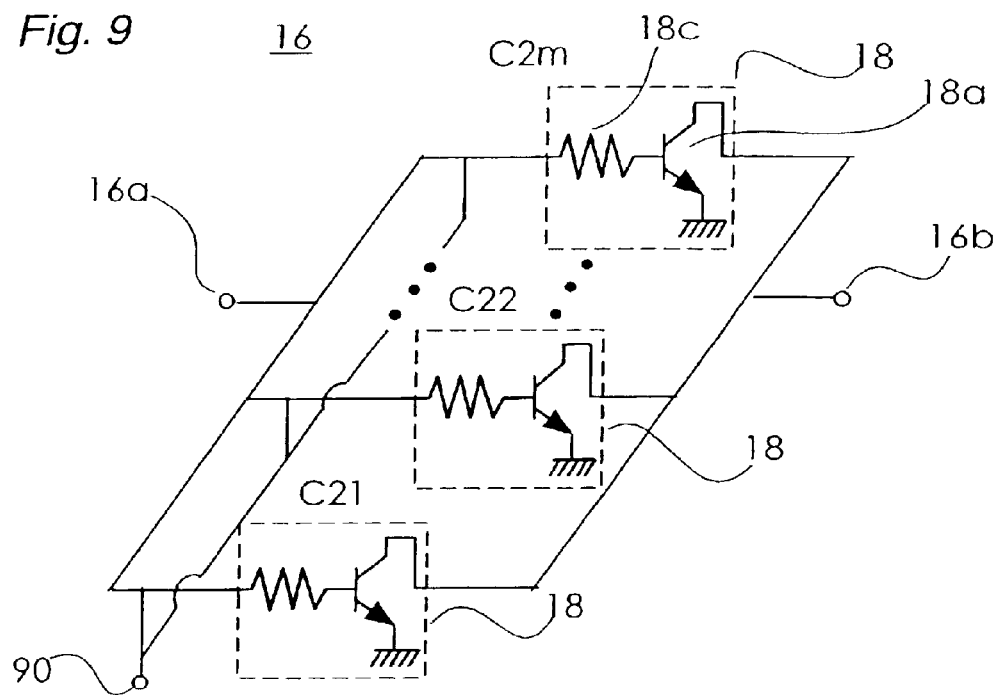
FIG. 9 is a typical diagram showing an equivalent circuit of a multifinger HBT using base ballast resistors, according to the present invention.
Figure 10:
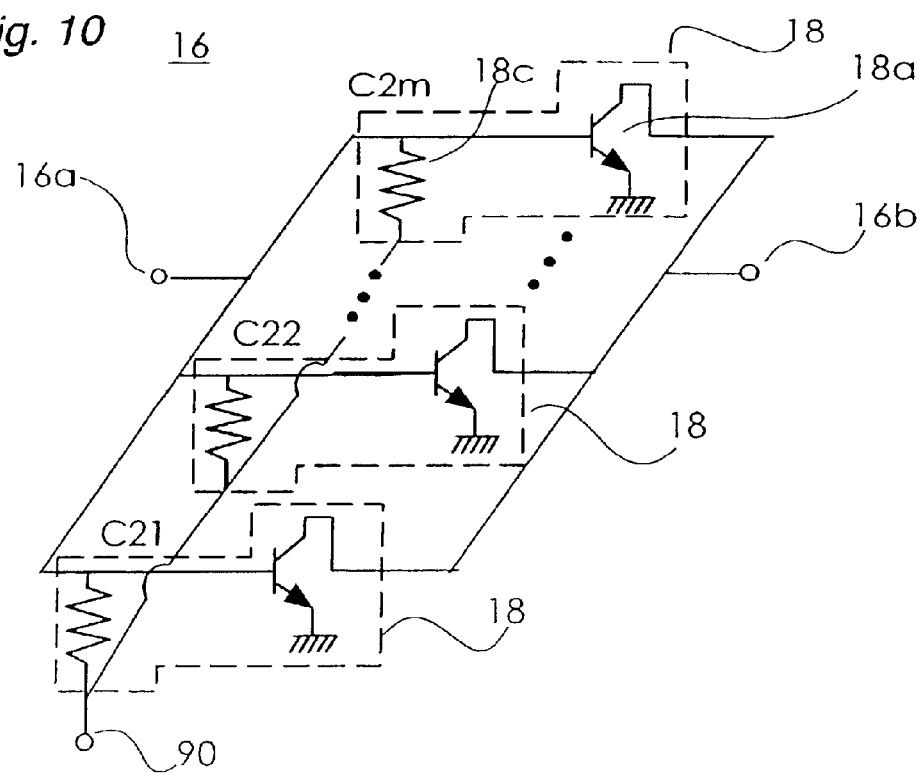
FIG. 10 is a typical diagram showing an equivalent circuit of a multifinger HBT using base ballast resistors, according to the present invention.
Figure 11:
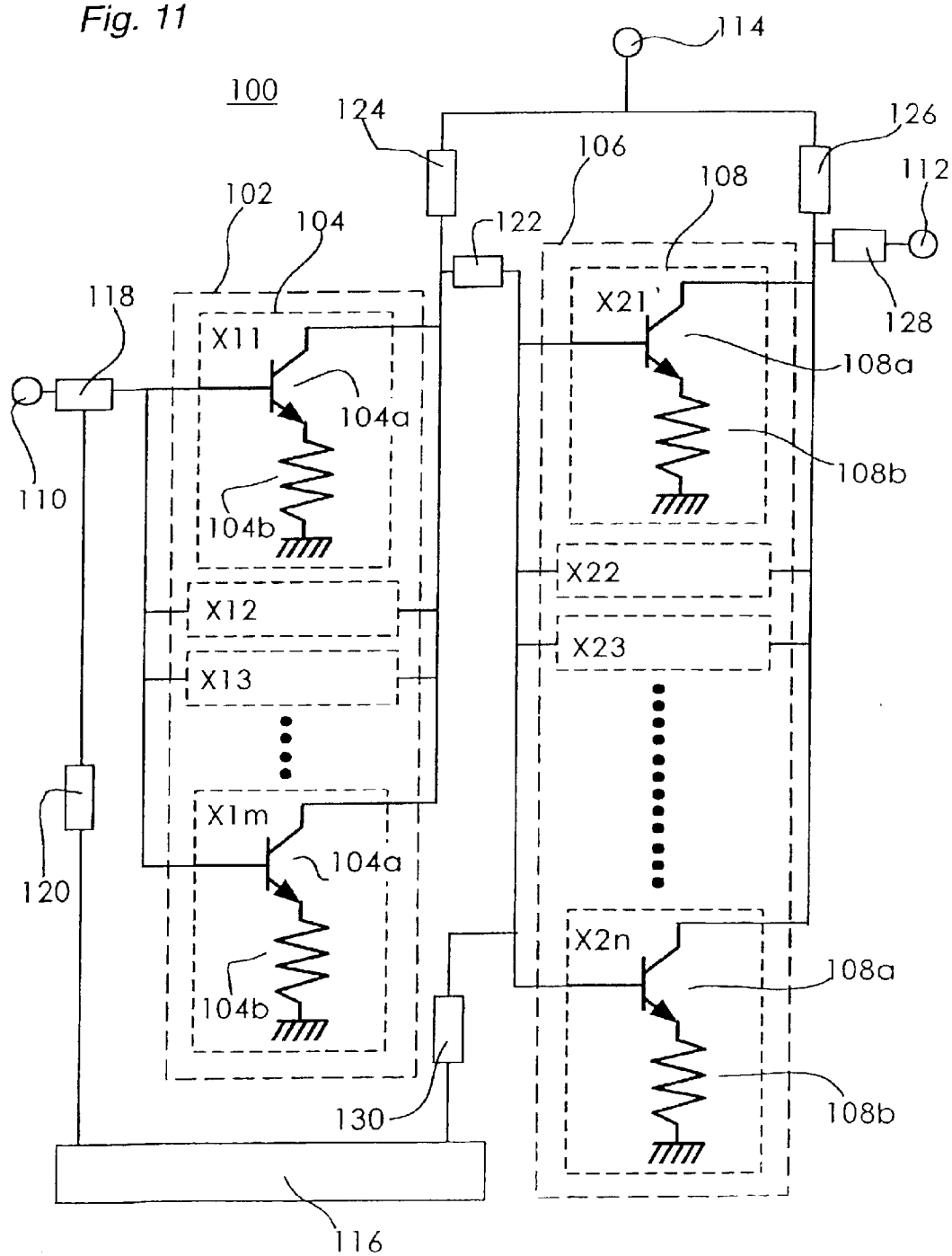
FIG. 11 is a block diagram showing a configuration of a conventional high output power amplifier.
Figure 12:
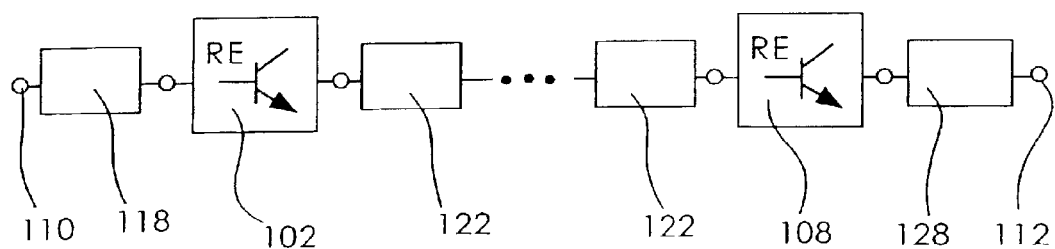
FIG. 12 is a block diagram of a conventional HBT multistage amplifier configured using only HBT devices which make use of emitter ballast resistors.
Figure 13:
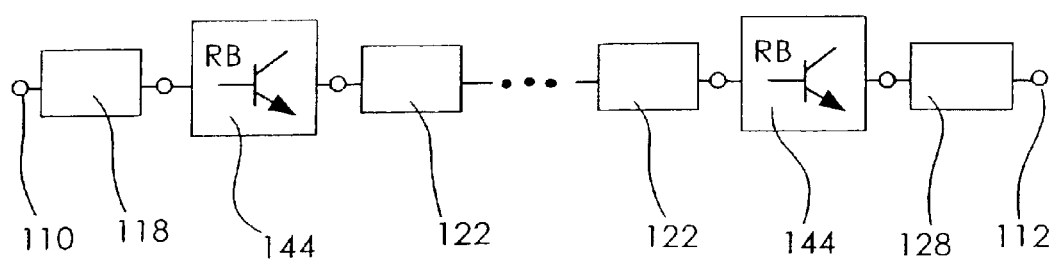
FIG. 13 is a block diagram of a conventional HBT multistage amplifier constructed using only HBT devices using base ballast resistors.

FIGS. 9 and 10 are typical diagrams showing equivalent circuits of a multifinger HBT16 using base ballast resistors, according to the present invention, e.g., the final-stage HBT device 87 shown in FIG. 6. Reference numeral 16*a* indicates a base terminal of the multifinger HBT 16, and 16*b* indicates a collector terminal of the multifinger HBT 16.

FIG. 9 shows a case in which a base ballast resistor 18*c* is inserted into the HBT 18*a* side as seen from each base bias terminal 90 between the base terminal 16*a* and each of HBTs 18, and FIG. 10 shows a case in which a base ballast resistor 18*c* is inserted between a base bias terminal 90 and each of HBTs 18*a*. In either case, the base ballast resistors 18*c* are each inserted between the HBT 18*a* and the base bias terminal 90.

When an emitter current of a certain HBT 18*a* increases due to a temperature distribution, a base current thereof also increases in proportion to the emitter current. As a result, a voltage drop developed by each base ballast resistor 18*c* also increases. Thus, a base-to-emitter voltage of the HBT 18*a* decreases and consequently the increase in the emitter current is suppressed. Accordingly, the base ballast resistors 18*c* make it possible to suppress low, a current between the HBTs 18*a* and the difference in temperature therebetween, restrain thermal runaway, and uniformly operate the respective HBTs 18*a*. Thus, the distribution and combination of signals for each of the HBTs 18*a* can be carried out with efficiency, and high-output and high-efficiency amplifying characteristics can be realized.

Incidentally, the base ballast resistors may take such configurations as shown in FIGS. 9 and 10. Alternatively, a configuration using both the base ballast resistors shown in FIGS. 9 and 10 may be taken.

The operation of the HBT multistage amplifier 85 will next be described.

A signal inputted from the input terminal 20 is amplified by the first-stage HBT device 86 using the emitter ballast resistors with the input matching circuit 28 interposed therebetween. Further, the so-amplified signal is amplified via the interstage matching circuits 32 by the intermediate stage HBT devices 88 and 89 each comprised of the HBT device using the emitter ballast resistor or the HBT device using the base ballast resistor. The amplified signal is finally inputted to the final-stage HBT device 87 using the base ballast resistors, where it is amplified and outputted from the output terminal 22 via the output matching circuit 30. The signal is amplified by the multistage HBT amplifier 85 in this way.

Since the first-stage HBT device 86 using the emitter ballast resistors, the intermediate HBT device 88 using the emitter ballast resistor or the base ballast resistor, and the final-stage HBT device 87 using the base ballast resistors are each used as an amplifying element, the multistage HBT amplifier is thermally stable and the respective HBTs14*a* and 18*a* can be operated uniformly. Accordingly, the distribution and combination of signals at each of the HBTs 14*a* and 18*a* are carried out with efficiency, and high-output and high-efficiency characteristics can be realized.

In FIG. 6, the input amplifier circuit 91 including the first-stage amplifier circuit makes use of at least the first-stage HBT device 86 using the emitter ballast resistors, as the amplifying element, whereas the output amplifier circuit 92 including the final-stage amplifier circuit uses at least the final-stage HBT device 87 using the base ballast resistors, as the amplifying element. Thus, since the first-stage HBT device 86 using the emitter ballast resistors profitable to noise characteristics is used in the input amplifier circuit 91 including the first-stage amplifier circuit which most influences the noise characteristics, low noise characteristics can be realized. On the other hand, since the final-stage HBT device 87 using the base ballast resistors profitable to output power and efficiency characteristics is used in the output amplifier circuit 92 including the final-stage amplifier circuit which most influences the output power and the efficiency characteristics, high-output and high-efficiency characteristics can be materialized.

Thus, since the HBT multistage amplifier 85 according to the present invention uses the first-stage HBT device 86 using at least the emitter ballast resistors, in the input amplifier circuit 91, and uses the final-stage HBT device 87 using at least the base ballast resistors, in the output amplifier circuit 92, high-output and high-efficiency characteristics and low noise characteristics can be realized simultaneously.

Incidentally, the HBT multistage amplifier 85 of the present invention results in a configuration wherein when it is of a two-stage amplifier, a first stage makes use of an HBT device using emitter ballast resistors, as an amplifying element, and a second stage uses an HBT device using base ballast resistors, as an amplifying element.

In the case of more than or equal to three stages, a first stage makes use of an HBT device using emitter ballast resistors as an amplifying element, and a final stage utilizes an HBT device using base ballast resistors as an amplifying element. In the case of intermediate amplifying stages other than those, HBT devices using either the emitter ballast resistors or the base ballast resistors may be used.

Further, the emitter ballast resistors and the base ballast resistors may be made up of epi-resistors, thin-film resistors or implanted resistors or the like on a semiconductor substrate.

The base bias terminals 90 may be used in common with the base terminals 12*a* and 16*a*.

The HBT device using the base ballast resistors may take a configuration wherein both the base ballast resistors shown in FIGS. 9 and 10 are used, in addition to the configuration shown in FIGS. 9 or 10.

While each of the configurations of the HBT devices shown in the respective embodiments corresponds to the configuration in which the basic HBTs are one-dimensionally disposed, such a configuration may be a configuration wherein the basic HBTs are two-dimensionally disposed, or may be one wherein they are placed in parallel in the form of other layouts.

According to the HBT multistage amplifier related to the present invention as described above, since it constitutes a multistage amplifier, a signal can be amplified.

Since HBT devices each using emitter or base ballast resistors are used as amplifying elements, they are thermally stable and can be operated uniformly. Accordingly, the distribution and combination of signals in the respective HBTs are carried out with efficiency, and high-output and high-efficiency characteristics can be realized.

Since an input amplifier circuit including a first-stage amplifier circuit makes use of a first-stage HBT device using at least emitter ballast resistors as an amplifying element, and an output amplifier circuit including a final-stage amplifier circuit uses a final-stage HBT device using at least base ballast resistors as an amplifying element, high-output and high-efficiency characteristics and low noise characteristics can be realized simultaneously.

INDUSTRIAL APPLICABILITY

As described above, a high-frequency semiconductor device according to the present invention is useful as a high output power amplifier used in satellite communications, ground microwave communications, mobile communications, etc. The high-frequency semiconductor device is suitable for an amplifier that requires satisfactory noise characteristics as well as a high output and high efficiency as in the case of transmitters in these communication fields in particular.

What is claimed is:

1. A high-frequency semiconductor device, comprising:
   a first amplifier stage including first transistors, each having a first bipolar transistor of a heterojunction structure, an collector electrode output, and an emitter resistor having a resistance value of RE1 connected in series with an emitter electrode of the first bipolar transistor, said first transistors connected in parallel in a plural form and disposed on a first semiconductor substrate, said first amplifier stage configured to amplify an input signal and having a common output connected to each of said collector electrode outputs; and
   a second amplifier stage in series with the first amplifier stage and configured to amplify a signal outputted from the common output of said first amplifier stage and including second transistors each having a second bipolar transistor of a heterojunction structure and a base resistor having a resistance value of RB2 connected in series with a base electrode of the second bipolar transistor, said second transistors connected in parallel in a plural form and disposed on a second semiconductor substrate.

2. The high-frequency semiconductor device according to claim 1, wherein the second transistors are further provided with emitter resistors connected in series with emitter electrodes of the second bipolar transistors, and the resistance values of the base resistors connected in series with the base electrodes of the second bipolar transistors are set smaller than RB2.

3. The high-frequency semiconductor device according to claim 1, wherein an emitter interval between the adjacent first transistors in the first amplifier stage is set wider than an emitter interval between the adjacent second transistors in the second amplifier stage.

4. The high-frequency semiconductor device according to claim 2, wherein an emitter interval between the adjacent first transistors in the first amplifier stage is set wider than an emitter interval between the adjacent second transistors in the second amplifier stage.

5. The high-frequency semiconductor device according to claim 3, wherein the resistance values of the emitter resistors of the first transistors in the first amplifier stage are set smaller than RE1.

6. The high-frequency semiconductor device according to claim 4, wherein the resistance values of the emitter resistors of the first transistors in the first amplifier stage are set smaller than RE1.

7. A high-frequency semiconductor device, comprising:
   a first amplifier stage including first transistors, each having a first bipolar transistor of a heterojunction structure, a collector electrode output, a base resistor having a resistance value of RB1 connected in series with a base electrode of the first bipolar transistor, and an emitter resistor having a resistance value of RE1 connected in series with an emitter electrode of the first bipolar transistor, said first transistors connected in parallel in a plural form at emitter intervals W1, said first transistors disposed on a first semiconductor substrate, said first amplifier stage configured to amplify an input signal and having a common output connected to each of said collector electrode outputs; and
   a second amplifier stage in series with the first amplifier stage and configured to amplify a signal outputted from the common output of the first amplifier stage and including second transistors each having a second bipolar transistor of a heterojunction structure, a base resistor having a resistance of RB2 connected in series with a base electrode of the second bipolar transistor, and an emitter resistor having a resistance value of RE2 connected in series with an emitter electrode of the second bipolar transistor, said second transistors connected in parallel in a plural form at emitter intervals W2 and disposed on a second semiconductor substrate;

wherein the intervals W1 and W2 are set as follows:

$$W1 > W2 \quad (1).$$

8. The high-frequency semiconductor device according to claim 7, wherein a relationship between the resistance value RE1 of the emitter resistor of said each first transistor and the resistance value RE2 of the emitter resistor of said each second transistor is established as follows:

$$RE1 < RE2 \quad (2); \text{ and}$$

a relationship between the resistance value RB1 of the base resistor of said each first transistor and the resistance value RB2 of the base resistor of said each second transistor is established as follows:

$$RB1 < RB2 \quad (3).$$

9. The high-frequency semiconductor device according to claim 1, wherein the first amplifier stage corresponds to a first stage, and the second amplifier stage corresponds to an output stage.

10. The high-frequency semiconductor device according to claim 7, wherein the first amplifier stage corresponds to a first stage, and the second amplifier stage corresponds to an output stage.

11. The high-frequency semiconductor device according to claim 1, wherein the first semiconductor substrate and the second semiconductor substrate are integrally formed.

12. The high-frequency semiconductor device according to claim 7, wherein the first semiconductor substrate and the second semiconductor substrate are integrally formed.

13. A high-frequency semiconductor device, comprising:

a first amplifier circuit section including a first-stage amplifier circuit comprising a first bipolar transistor device of a heterojunction structure having a collector electrode output and connected with emitter ballast resistors, said first-stage amplifier circuit configured to amplify an input signal and having a common output connected to each of said collector electrode outputs; and a second amplifier circuit section in series with the first amplifier circuit section and configured to amplify a signal outputted through the common output of the first-stage amplifier circuit and including a final-stage amplifier circuit comprising a second bipolar transistor device of a heterojunction structure connected with base ballast resistors.

14. The high-frequency semiconductor device according to claim 13, wherein:

the first bipolar transistor device includes first transistors connected in parallel in a plural form, each having a first bipolar transistor of a heterojunction structure and an emitter ballast resistor connected to the first bipolar transistor, and the second bipolar transistor device includes second transistors connected in parallel in a plural form, each having a second bipolar transistor of a heterojunction structure and a base ballast resistor connected to the second bipolar transistor.

* * * * *